(12) United States Patent
Jonker et al.

(10) Patent No.: US 11,476,353 B2
(45) Date of Patent: Oct. 18, 2022

(54) LATERAL HETEROJUNCTIONS IN TWO-DIMENSIONAL MATERIALS INTEGRATED WITH MULTIFERROIC LAYERS

(71) Applicant: The Government of the United States of America, as represented by the Secretary of the Navy, Arlington, VA (US)

(72) Inventors: Berend T. Jonker, Waldorf, MD (US); Connie H. Li, Alexandria, VA (US); Kathleen M. McCreary, Washington, DC (US); Olaf M. J. van 't Erve, Falls Church, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 412 days.

(21) Appl. No.: 15/819,959

(22) Filed: Nov. 21, 2017

(65) Prior Publication Data
US 2018/0158934 A1    Jun. 7, 2018

Related U.S. Application Data

(60) Provisional application No. 62/424,722, filed on Nov. 21, 2016, provisional application No. 62/424,711, filed on Nov. 21, 2016.

(51) Int. Cl.
*H01L 29/66* (2006.01)
*H01L 33/00* (2010.01)
(Continued)

(52) U.S. Cl.
CPC ... *H01L 29/66977* (2013.01); *G01N 27/4141* (2013.01); *H01L 21/02658* (2013.01);
(Continued)

(58) Field of Classification Search
CPC .......... H01L 21/02568; H01L 21/0262; H01L 21/02658; H01L 29/66977; H01L 29/7393; H01L 29/78696; H01L 33/002
See application file for complete search history.

(56) References Cited

U.S. PATENT DOCUMENTS

2009/0097299 A1*  4/2009  Tanaka .................... H01L 27/10
                                                         365/145
2015/0333196 A1* 11/2015  Shin ........................ H01L 31/08
                                                         257/29
(Continued)

FOREIGN PATENT DOCUMENTS

WO    WO 2004003972 A2 *  1/2004   ......... H01L 51/0512

OTHER PUBLICATIONS

"Artificial honeycomb lattices for electrons, atoms and photon" Marco Polini, Francisco Guinea, Maciej Lewenstein, Hari C. Manoharan & Vittorio Pellegrini Nature Nanotechnology vol. 8, pp. 625-633 (2013).
(Continued)

*Primary Examiner* — Steven M Christopher
(74) *Attorney, Agent, or Firm* — US Naval Research Laboratory; Roy Roberts (57) ABSTRACT

The invention relates to heterostructures including a layer of a two-dimensional material placed on a multiferroic layer. An ordered array of differing polarization domains in the multiferroic layer produces corresponding domains having differing properties in the two-dimensional material. When the multiferroic layer is ferroelectric, the ferroelectric polarization domains in the layer produce local electric fields that penetrate the two-dimensional material. The local electric fields modulate the charge carriers and carrier density on a nanometer length scale, resulting in the formation of lateral p-n or p-i-n junctions, and variations thereof appropriate for
(Continued)

device functions. Methods for producing the heterostructures are provided. Devices incorporating the heterostructures are also provided.

10 Claims, 8 Drawing Sheets (51) Int. Cl.
G01N 27/414 (2006.01)
H01L 21/02 (2006.01)
H01L 29/786 (2006.01)
H01L 21/18 (2006.01)
H01L 33/04 (2010.01)
H01L 33/26 (2010.01)
H01L 29/24 (2006.01)
H01L 29/778 (2006.01)
H01L 29/861 (2006.01)
H01L 29/739 (2006.01)

(52) U.S. Cl.
CPC ...... H01L 21/187 (2013.01); H01L 29/78696 (2013.01); H01L 33/002 (2013.01); H01L 21/0242 (2013.01); H01L 21/0262 (2013.01); H01L 21/02381 (2013.01); H01L 21/02488 (2013.01); H01L 21/02568 (2013.01); H01L 29/24 (2013.01); H01L 29/7391 (2013.01); H01L 29/778 (2013.01); H01L 29/861 (2013.01); H01L 33/04 (2013.01); H01L 33/26 (2013.01)

(56) References Cited

U.S. PATENT DOCUMENTS

2015/0372298 A1\* 12/2015 Fujieda ............ H01M 10/0525
429/321
2018/0158934 A1\* 6/2018 Jonker ............. H01L 21/02658

OTHER PUBLICATIONS

Written Opinion of the International Searching Authority dated Mar. 21, 2018 in PCT/US2017/062813.

\* cited by examiner

LATERAL HETEROJUNCTIONS IN TWO-DIMENSIONAL MATERIALS INTEGRATED WITH MULTIFERROIC LAYERS

CROSS-REFERENCE TO RELATED APPLICATIONS

This application claims priority to U.S. Provisional Application No. 62/424,711, filed on Nov. 21, 2016, and U.S. Provisional Application No. 62/424,722, filed on Nov. 21, 2016, the contents of which are incorporated herein by reference in their entirety.

TECHNICAL FIELD

This application relates generally to heterostructures including a layer of a two-dimensional material placed on a multiferroic layer. An ordered array of differing polarization domains in the multiferroic layer produces corresponding domains having differing properties in the two-dimensional material. When the multiferroic layer is ferroelectric, the ferroelectric polarization domains in the layer produce local electric fields that penetrate the two-dimensional material. The local electric fields modulate the charge carriers and carrier density on a nanometer length scale, resulting in the formation of lateral p-n or p-i-n junctions, and variations thereof appropriate for device functions. Methods for producing the heterostructures are provided. Devices incorporating the heterostructures are also provided.

BACKGROUND

The conventional method for introducing an electric field and varying the carrier density in a semiconductor channel is to use an electrostatic gate consisting of an insulating dielectric layer (typically an oxide) and a metal contact layer over the semiconductor transport channel. Such gates are fabricated using standard lithographic techniques, and they are normally used to apply an electric field, but their geometry is fixed once they are fabricated. The intent is to control charge flow, not determine the luminescent or chemical sensing properties. Strain is normally introduced by mechanical means.

Ferroelectric films have recently been used as the gate dielectric in transistor structures because their polarization is non-volatile (it remains after the gate voltage has been removed). A ferroelectric transistor utilizes the nonvolatile, switchable polarization field of a ferroelectric gate to control the charge carrier density in the conducting channel. This approach is actively researched as an avenue to nonvolatile transistor memory, known as ferroelectric random access memory (FeRAM).

However, the conventional methods suffer from several drawbacks. The lateral size of such a gate is determined by the limits of the lithography used to produce it, and it cannot be changed once it is fabricated. The gate is typically on the top surface, and therefore covers the active material, preventing its use as either a chemical vapor sensor or as an optical emitter. The gate requires constant power, and electric field or charge disappears once the power is removed—such gates are volatile rather than non-volatile. Finally, doping with impurity atoms is irreversible, and introduces potential defects.

SUMMARY OF THE INVENTION

The invention described herein, including the various aspects and/or embodiments thereof, meets the unmet needs of the art, as well as others, by providing heterostructures including a layer of a two-dimensional material placed on a multiferroic layer. An ordered array of differing polarization domains in the multiferroic layer produces corresponding domains having differing properties in the two-dimensional material. When the multiferroic layer is ferroelectric, the ferroelectric polarization domains in the layer produce local electric fields that penetrate the two-dimensional material. The local electric fields can modulate the charge carriers and carrier density on a nanometer length scale, resulting in the formation of lateral p-n or p-i-n junctions, and variations thereof appropriate for device functions. Methods for producing the heterostructures are provided. Devices incorporating the heterostructures are also provided.

In accordance with one aspect of the invention, a heterostructure includes a multiferroic material layer; and a two-dimensional material layer provided on the multiferroic material layer. The multiferroic material layer comprises an array of polarization domains in the multiferroic layer, and produces corresponding lateral heterojunctions in the two-dimensional material.

According to another aspect of the invention, a light-emitting device includes a ferroelectric material layer; and a two-dimensional transition metal dichalcogenide (TMD) material layer provided on the ferroelectric material layer. The ferroelectric material layer includes an array of dipole domains in the ferroelectric material layer, and produces corresponding lateral heterojunctions in the two-dimensional TMD material layer.

According to a further aspect of the invention, a method for forming a heterostructure includes providing a multiferroic material layer; applying a local electric field to the multiferroic material layer, forming an array of polarization domains in the multiferroic layer; and providing a two-dimensional material layer on the multiferroic material layer having an array of polarization domains therein, wherein the polarization domains produce corresponding lateral heterojunctions in the two-dimensional material.

Other features and advantages of the present invention will become apparent to those skilled in the art upon examination of the following or upon learning by practice of the invention.

DETAILED DESCRIPTION OF EMBODIMENTS OF THE INVENTION

The invention described herein, including the various aspects and/or embodiments thereof, meets the unmet needs of the art, as well as others, by providing heterostructures including a layer of a two-dimensional material placed on a multiferroic layer. An ordered array of differing polarization domains in the multiferroic layer produces corresponding domains having differing properties in the two-dimensional material. When the multiferroic layer is ferroelectric, the ferroelectric polarization domains in the layer produce local electric fields that penetrate the two-dimensional material and modulate the charge carriers and carrier density on a nanometer length scale, resulting in the formation of lateral p-n or p-i-n junctions, and variations thereof appropriate for device functions. Methods for producing the heterostructures are provided. Devices incorporating the heterostructures are also provided.

The invention provides ways to control and modulate the carrier type and density of one or more 2D materials on the nanometer length scale, by coupling the 2D materials with multiferroic materials. In some aspects of the invention, a heterostructure is provided in which one layer is comprised of one or more 2D materials (either a single monolayer, or multiple monolayers having the same or different composition), and the adjacent layer is comprised of a multiferroic material. This multiferroic material can be a ferroelectric material, where local electrostatic domains consisting of dipole ensembles produce a local electric field, which penetrates the adjacent 2D material layer and produces an effect identical to that of a voltage applied to a conventional electrostatic gate consisting of an insulating dielectric layer. If the ferroelectric material is a thin film, the strength of the electric field is related to the thickness of the film. These domains can be oriented by a global applied electric field, or manipulated at the micron to nanoscale levels with an optical beam, proximal probe such as a conducting atomic force microscope tip (as illustrated in FIGS. 9A-9E), or other techniques including optical probes.

These polarization domains in the multiferroic or ferroelectric material can directly change the properties of adjacent 2D material monolayer(s), which are strongly affected by their immediate environment due to lack of bulk screening. The dielectric screening is very low due to their two-dimensional character relative to bulk material, and the screening that would normally occur due to carriers in a three-dimensional material is largely absent. Changes in environment in turn dramatically impact the carrier type and density of the 2D material. Modification of the carrier type and carrier density properties of discrete portions of the 2D material can be accomplished, for example, by variations in the local electric field induced by local dipoles in an adjacent ferroelectric layer. The invention beneficially achieves in-plane p-n type heterojunctions, rather than the conventional approach of stacking p-type and n-type layers vertically. These lateral, in-plane heterojunctions are easier to fabricate than vertical heterostructures, and avoid the significant complexities associated with vertical van der Waals heterostructures.

Heterostructures and Devices.

The heterostructures of the invention include a multiferroic material layer adjacent to (and preferably directly in contact with) one or more two-dimensional material layers.

The two-dimensional ("2D") materials of the invention may be provided in the heterostructure as a single monolayer, or provided as multiple monolayers. When multiple monolayers are used, preferably from 2 to 20 monolayers are provided, more preferably from 2 to 10, still more preferably from 3 to 6. The monolayers may be formed from a variety of materials, including transition metal dichalcogenides ("TMDs"), silicene, phosphorene, and graphene. The TMDs for use in the apparatus and methods of the invention have the chemical formula MX$_2$, where M is a transition metal, and X is a chalcogen.

Transition metals include elements from Groups 3-12 of the periodic table. The transition metals include Sc, Ti, V, Cr, Mn, Fe, Co, Ni, Cu, Zn, Y, Zr, Nb, Mo, Tc, Ru, Rh, Pd, Ag, Cd, La, Hf, Ta, W, Re, Os, Ir, Pt, Au, Hg, Ac, Rf, Db, Sg, Bh, Hs, Mt, Ds, Rg, and Cn, as well as the lanthanide series elements (La, Ce, Pr, Nd, Pm, Sm, Eu, Gd, Tb, Dy, Ho, Er, Tm, Yb, and Lu), and actinide series elements (Ac, Th, Pa, U, Np, Pu, Am, Cm, Bk, Cf, Es, Fm, Md, No, Lr). Preferred transition metals for use in the apparatus and methods of the invention include Mo, W, Nb, Hf, Ta, and V, with Mo, W, Nb, and Ta being particularly preferred.

Chalcogens include the elements found in Group 16 of the periodic table. The chalcogens include O, S, Se, Te, and Po. Preferred chalcogens for use in the apparatus and methods of the invention include S, Se, and Te, with S and Se being particularly preferred.

In some aspects of the invention, preferred 2D TMD materials for use in the sensors, systems, and methods may be selected from the group consisting of MoS$_2$, MoSe$_2$, WS$_2$, WSe$_2$, VS$_2$, VSe$_2$, VTe$_2$, NbS$_2$, NbSe$_2$, TaS$_2$, TaSe$_2$, and combinations thereof. Additional TMD materials formed from the transition metals and chalcogens set forth above are also within the scope of the invention.

The heterostructures of the invention beneficially eliminate the need for impurity doping or physical modification of the 2D layer to create n- or p-type domains. TMD monolayers are known to be ambipolar (i.e., they can be biased to be either n- or p-type). The heterostructures of the invention incorporating multiferroic materials having arrays of polarization domains enable the creation of n- and p-type lateral heterojunctions within the 2D material layers, without the need for extrinsic doping. This obviates problems associated with dopant density, incorporation, activation, diffusion, defect formation, chemical stability, etc., all of which are major issues encountered when using extrinsic dopant atoms.

The multiferroic material can be any material that exhibits more than one primary ferroic order parameter (which include ferromagnetism, ferroelectricity, and ferroelasticity). In some aspects of the invention, the multiferroic material is a ferroelectric (FE) material, where local electrostatic domains consisting of dipole ensembles exist and produce a local electric field, modifying the dielectric environment. These local domains modify and control the optical, transport and other electronic properties of the two-dimensional material. The multiferroic materials may include, but are not limited to, $BiMnO_3$, $LaMnO_3$, and $BiFeO_3$, and combinations thereof. Ferroelectric materials may include, but are not limited to, lead zirconate titanate (PZT), barium titanate, lead titanate, lead magnesium niobate-lead titanate (PMN-PT), and combinations thereof. Composites of any of these materials may also be used.

The multiferroic layer used in the invention may be provided as a bulk substrate or thin film. When the multiferroic layer is a thin film, it may range from about 1 nm in thickness up to many microns in thickness. The thin film may optionally be supported by a substrate material such as silica ($SiO_2$), silicon, $SiO_2$/Si, or sapphire, but the invention is not limited to any particular substrate material. For example, growth of multiferroic or ferroelectric thin films on periodically poled wafers may be preferred in some aspects of the invention, to provide laterally templated growth of layers deposited thereon. Examples of substrates that may be provided, optionally as templated substrates, are lithium niobate and strontium titanate.

The 2D material monolayers of the invention may be exfoliated, mechanically transferred, or grown directly on the multiferroic or ferroelectric material by deposition techniques such as chemical vapor deposition. For example, multiple methods are available to mechanically transfer TMD monolayers, such as $WS_2$, onto alternate substrates, such as multiferroic or ferroelectric films. The transfers may be conducted using a thin layer of a transfer material, such as a PMMA (polymethyl methacrylate), PC (polycarbonate), or PDMS (polydimethylsiloxane)/PC film. The direct integration of the multiferroic with the 2D material results in the smallest possible separation (≤1 nm) between the two, thereby maximizing the electric field resulting from the polarization domains in the ferroelectric material. There is no intervening dielectric layer, as there is in a conventional electrostatic gate contact. Because the ferroelectric dipole electric field decreases with distance R, and corresponds to approximately $R^{-3}$, the electric field strength at the 2D layer is as large as it can be when the 2D material lies directly on top of the ferroelectric layer. This electric field penetrates the 2D material layer and modifies its local carrier density, making in n-type, p-type, or insulating, which affects transport and optical properties. An ordered array of polarization domains produces a corresponding ordered variation in carrier densities, which impacts electronic and transport properties. A periodic array of such domains may impose a super period on the 2D material layer and a corresponding change in band structure, producing tailored electronic properties that reflect the symmetry of the periodic array.

Ferroelectric materials exhibit a spontaneous polarization due to internal electric dipoles which are coupled to the lattice. Typical examples include $BaTiO_3$, $BiFeO_3$, and $PbTiO_3$. They can be polarized in a particular direction and manner by a global applied electric field—this polarization is retained even after the electric field is removed (this is analogous to a magnetic material which exhibits a spontaneous magnetization, and the magnetization is retained in the absence of an applied magnetic field). The polarization can also be reversed by a global applied electric field, and the hysteresis depends upon factors that are both intrinsic (e.g., coupling of the internal dipoles to the lattice) and extrinsic (e.g., interfaces, sample structure and aspect ratio).

Ensembles of these dipoles form local domains within the ferroelectric material, with a net polarization oriented in a particular direction (up or down), just as magnetic domains exist in a ferromagnet. The invention beneficially provides methods for forming local domains in the heterostructures and devices, which can be oriented and manipulated on length scales ranging from a single nanometer to several microns, by application of a highly localized electric field applied, for example, using proximal probe techniques, such as through a voltage applied between the ferroelectric material surface and the tip of an atomic force microscope (AFM), which is preferably operated as a conducting atomic force microscope (CAFM). Isolated domains can be created in predetermined locations, or an ordered array of domains may be fabricated. Thus, the properties of the adjacent 2D materials can be controlled and modified with the same spatial resolution, i.e., if a 10 μm×10 μm checkerboard pattern is created in the ferroelectric material, the properties of the 2D material layer will also be modified in a 10 μm×10 μm pattern.

The heterostructures of the invention allow for writing and rewriting the polarization domains of the ferroelectric material in any order, size, spacing, or period, and at any time, in a non-destructive and reversible fashion, permitting the heterostructures to form the basis of a reconfigurable electronic system. The polarization domains may be provided in any arrangement, without limitation. Exemplary polarization domain configurations include a checkerboard pattern, or concentric shapes (including, without limitation, squares, rectangles, circles, ovals, shapes exhibiting one or more axes of symmetry, or irregular shapes). The polarization domains are non-volatile, and no refresh power is required. The heterostructures also permit a global erase function, which may be achieved when a global electric field is used to erase any domains written in the ferroelectric layer.

The polarization domains in an adjacent ferroelectric layer provide charge doping or local electric fields, and these domains can be used instead of an electrostatic gate to control whether the 2D material is n- or p-type. This beneficially permits fabrication of lateral n- or p-type regions in the 2D material in a reversible, non-volatile manner on a nanometer length scale (i.e., the regions may be formed on a scale of about 1 nm or larger). They have applications in nonvolatile memory, low power electronics, reprogrammable logic, complementary chemical vapor sensors, and tunable optical devices, among others.

The heterostructures of the invention may be used in any electronic devices that operate based on modifications in carrier type and density. In particular, in-plane carrier transport can be more readily controlled in a 2D material layer by surface electrostatic gating because the transport channel is so thin (for example, on the order of 1 to 3 nm). A small gate voltage can more easily pinch off the channel than in a bulk three-dimensional structure, producing high "on/off" ratios at lower gate voltage values. In addition, an electrostatic gate in a 2D material layer can effectively control the carrier type as well as the carrier density, so that application of a suitable gate voltage can make the material n-type (n), p-type (p), or intrinsic (i), in which the transport is dominated by electron or hole motion, or is nearly insulating, respectively.

The heterostructures of the invention are broadly applicable to devices including diodes, transistors, electroluminescent/light-emitting devices structures exhibiting negative differential resistance, and non-volatile transistor memory. When used in devices, the heterostructures of the invention may optionally be combined with any suitable components, including, but not limited to, electronic contacts, and electromagnetic signal transmitters. Signal transmitters may optionally be used, for example, to generate a signal to indicate that the 2D material layer has interacted with an agent of interest. However, it is to be appreciated that one of the benefits of the invention is the simplified fabrication that it permits by eliminating deposition and lithography steps necessary to deposit and define dielectric layers and top metal layer, as no discrete insulating dielectric layer or top metal contact are required to introduce the local electric fields. In addition, this approach offers lateral spatial resolution that is comparable to or better than that available with existing lithographic techniques.

Figure 1:
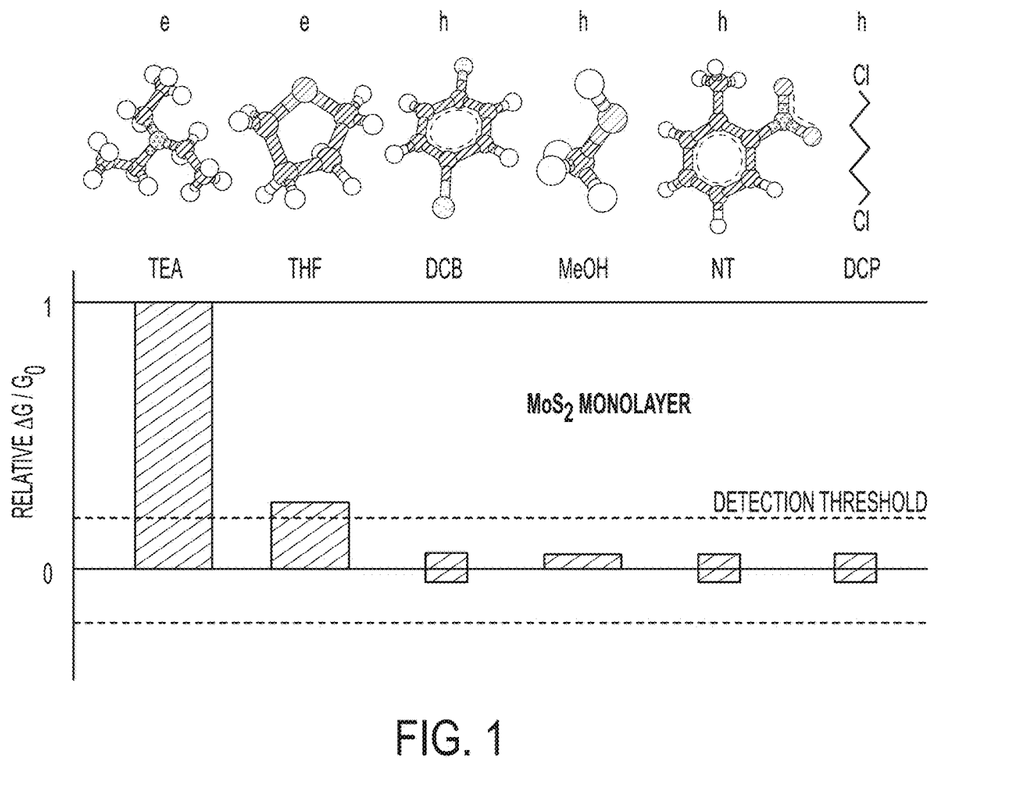
FIG. 1 is a graph showing the relative $\Delta G/G_0$ for an n-type $MoS_2$ monolayer exposed to electron-donating molecules and hole-donating molecules.
Figure 2:
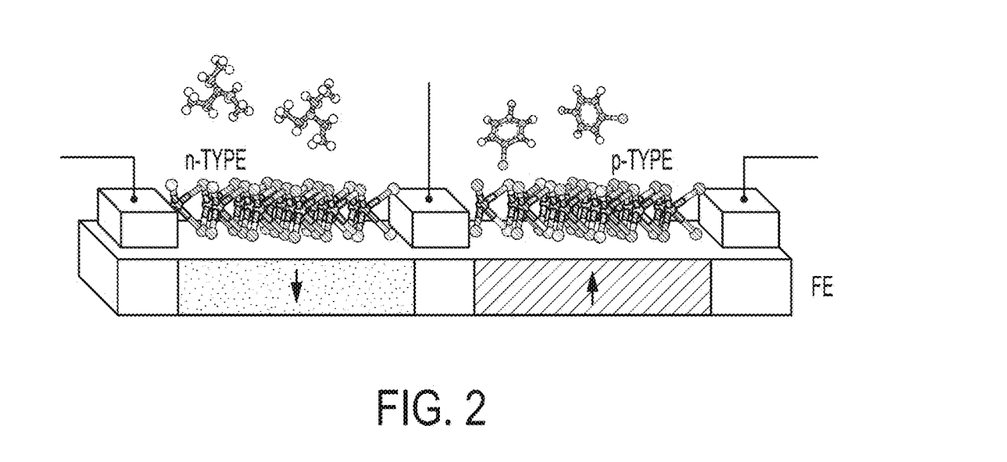
FIG. 2 is a depiction of a chemical sensor device in which polarization domains in an underlying ferroelectric layer create n-type and p-type domains.

In one preferred application for the heterostructures of the invention, sensors are provided. The conductivity of monolayer TMDs, such as n-type $MoS_2$ monolayers, increases when exposed to electron-donating molecules (labeled "e"), and shows no response to hole-donating molecules (labeled "h"). See FIG. 1. The sensor devices of the invention use the polarization domains in ferroelectric materials underlying the TMD monolayer(s) to create local n- and p-type domains in the TMD monolayer(s), which beneficially permits simultaneous detection of electron- and hole-donating molecules with same detector, enabling more comprehensive detection and more positive identification. See FIG. 2.

Lateral Heterojunctions in 2D Materials.

The heterostructures, devices, and methods of the invention may beneficially be used to address the difficulties resulting from the high level of sensitivity that 2D materials exhibit in response to their environment. For example, the resistivity of 2D materials may change with charge transfer from surface adsorbates, which is useful for applications such as chemical sensing. The change with exposure to a given molecule depends upon whether the material is n- or p-type, and many 2D materials are ambipolar (can be gated to be n- or p-type). The heterostructures of the invention may be configured as chemical sensors by forming alternating n/p domains in the 2D material.

In some aspects of the invention, the electric field(s) from the multiferroic layer can affect local carrier density, and can be used to make the 2D material layer n-type, p-type, or insulating, which affects transport and optical properties. An ordered array of polarization domains produces a corresponding ordered variation in carrier densities, which impacts electronic and transport properties. A periodic array of domains may impose a super period on the 2D material layer and a corresponding change in band structure, producing tailored electronic properties that reflect the symmetry of the periodic array.

Changes in environment can dramatically impact the carrier type and density of the 2D material. Modification of the carrier type and carrier density properties of discrete portions of the 2D material can be accomplished, for example, by variations in the local electric field induced by local dipoles in an adjacent ferroelectric layer. The invention beneficially achieves in-plane p-n type heterojunctions, rather than the conventional approach of stacking p-type and n-type layers vertically. These lateral, in-plane heterojunctions are easier to fabricate than vertical heterostructures, and avoid the significant complexities associated with vertical van der Waals hetero structures.

The heterostructures of the invention therefore beneficially include lateral p-n, p-i-n, p-n-p, or n-p-n junctions, or variations thereof appropriate for device functions. The properties of these 2D materials and the heterostructures including them can be modified and controlled by variations in the local electric field induced by dipoles in an adjacent layer. This effect and mechanism is distinct from an electric field applied by an electrostatic gate terminal. Devices incorporating these 2D material heterostructures may include, but are not limited to, diodes, transistors, electroluminescent/light-emitting devices, structures exhibiting negative differential resistance, and non-volatile transistor memory.

Figure 3A:
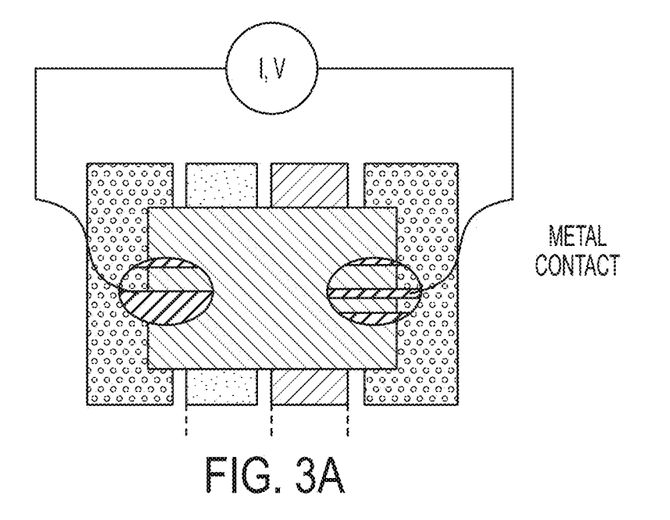
FIG. 3A is a top view of a p-n lateral heterostructure.
Figure 3B:
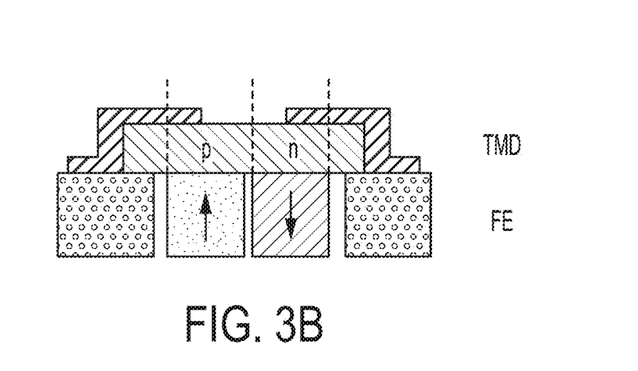
FIG. 3B is a cross-section of a p-n lateral heterostructure.
Figure 3C:
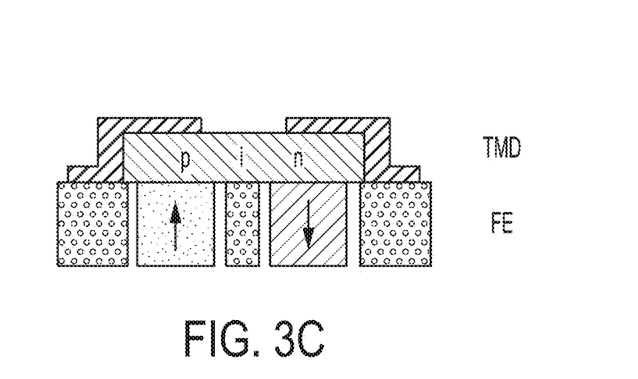
FIG. 3C is a cross-section of a p-i-n lateral heterostructure.
Figure 5A:
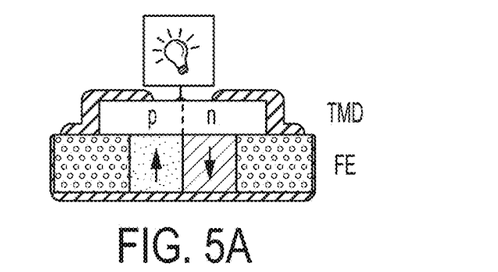
FIG. 5A is a cross-section of an LED device with a TMD layer incorporating lateral heterojunctions.

In accordance with another aspect of the invention, lateral p-n or p-i-n junctions may be formed in a 2D material layer. Stripes of dipole domains oriented up and down may be written into the ferroelectric layer, for example, using an AFM (see FIG. 3A), and a monolayer of 2D material, such as $MoSe_2$, is either mechanically transferred onto this surface, or grown directly thereon. The area of the $MoSe_2$ over the "up" domains is rendered p-type, and the area of the $MoSe_2$ over the "down" domains is rendered n-type, thus forming a lateral p-n junction (see FIG. 3B). No extrinsic dopant atoms or discrete electrostatic gates are introduced—only the electric field from the ferroelectric dipole domains is used to achieve n- and p-type doping. Electrical contacts may be attached to the p- and n-type sides, and when provided, are used to obtain the current-voltage characteristics of the lateral p-n junction, and are expected to exhibit rectifying behavior typical of such junctions, forming a lateral p-n junction diode. If the dipole domains are separated by an unpoled region of the ferroelectric layer, no net electric field exists in this region, and a p-i-n lateral heterojunction is formed, as illustrated in FIG. 3C. These p-n and p-i-n lateral heterojunctions can result in the emission of light—when a bias voltage is applied between the p- and n-type sides, electrons and holes are driven to the junction area and radiatively recombine. The light emitting devices created by the heterostructures of the invention are valuable electronic components, with applications for displays or optical interconnects. An exemplary LED structure formed using the heterostructures of the invention is depicted in FIG. 5A. The heterostructures of the invention may alternatively be configured for light absorption.

Figure 4:
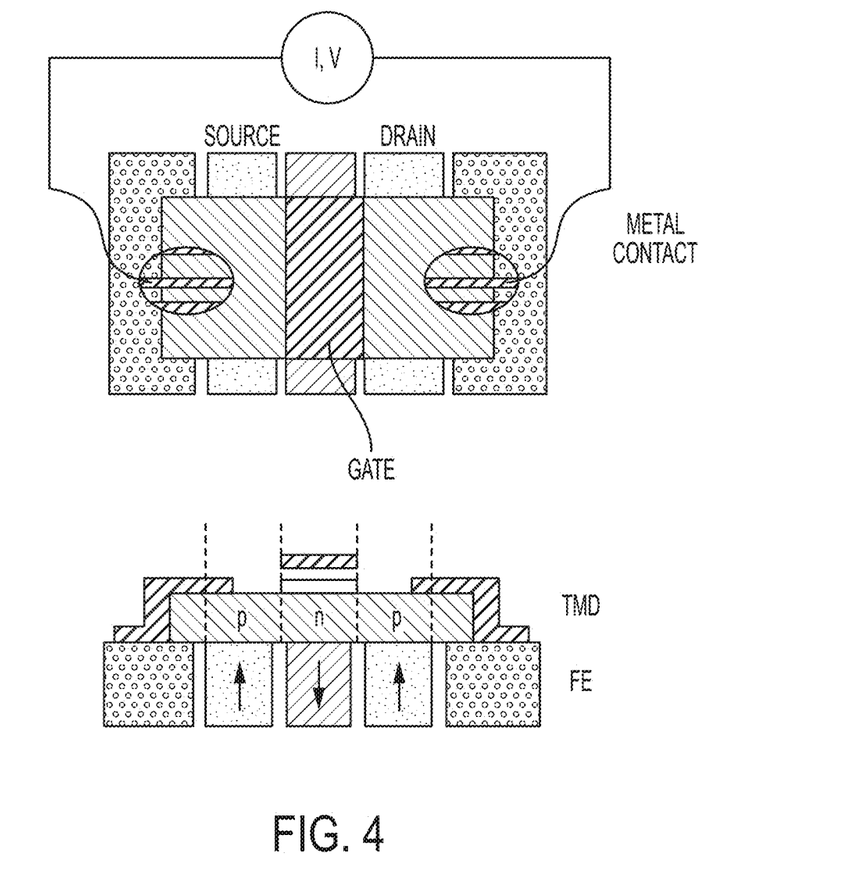
FIG. 4 is depiction of a gate contact used to control current flow through a lateral transistor heterostructure.
Figure 5B:
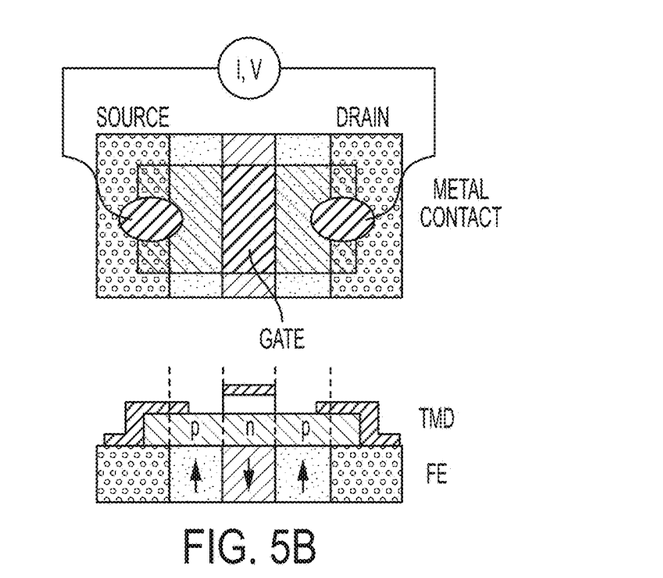
FIG. 5B is a cross-section of a lateral diode or transistor with a TMD layer incorporating lateral heterojunctions.
Figure 5C:
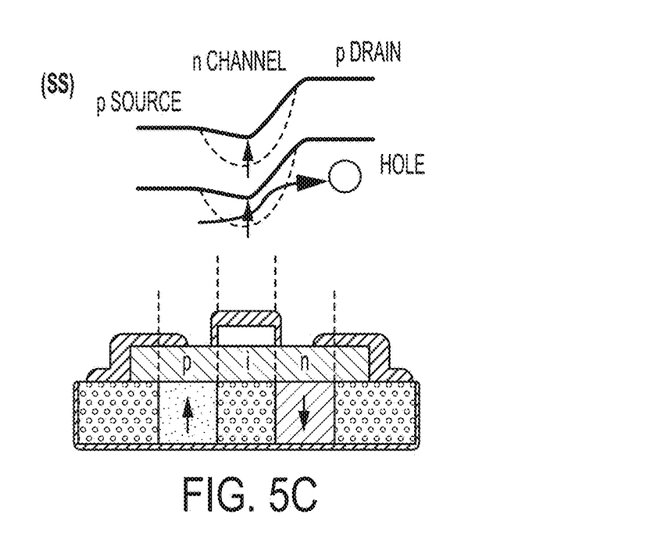
FIG. 5C is a cross-section of a tunnel field effect transistor with a TMD layer incorporating lateral heterojunctions.

In still other aspects of the invention, a lateral p-n-p or n-p-n heterojunction may be formed to create a lateral bipolar transistor or a tunnel field effect transistor, as depicted in FIG. 5B and 5C. Dipole domains written into the ferroelectric layer produce well-defined n- and p-type regions in an adjacent 2D layer, as described above. Extrinsic dopant atoms are not required to form this heterojunction, as is typically done in current semiconductor device technology—only the electric field from the ferroelectric dipole domains is used to achieve n- and p-type doping. FIG. 4 shows that a conventional gate contact may be used to control current flow through this lateral transistor structure. Similar lateral heterojunction can be designed to exhibit negative differential resistance, where valence band states in the p-layer become resonant with conduction band states in the n-layer for certain gate voltages, leading to enhanced conductivity at these select voltages, and lower conductivity for other gate voltages.

In further aspects of the invention, an ordered array of polarization domains may be formed. This produces a corresponding ordered variation in carrier densities in a 2D material layer. A periodic array of such domains may impose a super period on the 2D layer and a corresponding change in band structure. For example, a hexagonal potential modulation imposed by surface contacts upon a semiconductor two dimensional electron gas (2DEG), as may be found in GaAs, may produce a change in band structure resulting in properties similar to that of graphene. The linear band dispersion and Dirac cone characteristic of graphene derive from its hexagonal symmetry. Rather than using surface contacts, this periodic potential modulation may be produced by writing a domain pattern of selected symmetry in a ferroelectric layer, which produces a corresponding periodic potential modulation in an adjacent 2D layer. The resultant transport and optical properties of the 2D layer reflect this symmetry. If the symmetry is hexagonal, the band structure exhibits linear band dispersion rather than the pseudo-parabolic dispersion typical of 2D materials such as $MoS_2$ and phosphorene.

Methods.

The invention also provides methods for forming heterostructures, including, but not limited to, the heterostructures described herein. The methods include providing a multiferroic material layer and applying a local electric field to the multiferroic material layer in order to create one or more polarization domains in the multiferroic layer. For example, when the multiferroic material layer is a ferroelectric material layer, the polarization domains may comprise dipole domains.

The local electric field may be applied, for example, using an optical beam, a proximal probe (such as a conducting atomic force microscope tip), or other techniques including optical probes. When a conducting atomic force microscope is used, it may be operated at a bias voltage of from ±1 V to ±10 V. When the multiferroic material layer is a ferroelectric material, a positive tip voltage will result in polarization dipoles in the ferroelectric layer that point into the sample plane, and a negative charge at the surface of the ferroelectric layer. A negative tip voltage will result in polarization dipoles in the ferroelectric layer that point out of the sample plane, and a positive charge at the surface of the ferroelectric layer. An image of the poled surface may also be obtained using the atomic force microscope by operating it in EFM phase mode.

The polarization domains may be provided in any size, shape, pattern, or configuration that is desired, based on the properties or functions of the specific heterostructure being formed. The polarization domains may range from a nanometer scale (i.e., features having a width on the order of 1 nm or more) to multiple micron scale (i.e., features having a width on the order of 1 micron, 5 microns, 10 microns, or more). Polarization domains may be separated by domain walls having any desired width. In some aspects of the invention, the polarization domain wall width may be as low as from 1-10 nm, though wider domain walls are also included in the scope of the invention.

In some aspects of the invention, the local electric fields may be globally erased, for example, by exposing the entire multiferroic material layer, or the entire heterostructure, to a global electric field. Once erased, the multiferroic material layer may have new local electric fields applied. The process of globally erasing the polarization domains and providing a new configuration of polarization domains may be repeated multiple times. In other aspects of the invention, the polarization domains may be modified only in desired locations, by applying appropriate local electric fields to areas having polarization domains to be changed.

The local electric field may be applied to the multiferroic material layer prior to depositing a 2D material layer thereon, or it may be applied after the heterostructure including the multiferroic layer and 2D material layer has been formed. Regardless of the order of these steps, the polarization domains in the multiferroic material layer produce corresponding domains in the two-dimensional material layer that is provided on the multiferroic material layer.

The term "corresponding domains" is used to refer to domains in a 2D material layer that is part of a heterostructure, where the domains have properties (such as those described above) that are influenced by or result from proximity to a polarization domain of a multiferroic material. These domains are typically positioned opposite to a polarization domain formed in a multiferroic material.

The 2D material layer may be applied to the multiferroic material layer using a technique selected from the group consisting of mechanical exfoliation, mechanical transfer, and growth directly on the multiferroic material layer.

The 2D material layer may be applied directly to a multiferroic material layer in some aspects of the invention. When the 2D material layer is applied to a substrate and is transferred to the multiferroic layer, the transfer may be carried out using mechanical techniques. Regardless of the material to which it is applied, the 2D material layer may be deposited by chemical vapor deposition or other deposition or growth technique to a thickness of 1 monolayer (which is about 0.7 nm thick for a TMD monolayer, but those skilled in the art will appreciate that the thickness of the monolayer will depend on the specific monolayer composition). More than one monolayer may also be applied to form the 2D material layer, either by sequential application of layers or by depositing multiple layers simultaneously.

EXAMPLES

Aspects of the invention will now be particularly described by way of example. However, it will be apparent to one skilled in the art that the specific details are not required in order to practice the invention. The following descriptions of specific embodiments of the present invention are presented for purposes of illustration and description. They are not intended to be exhaustive of or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated.

Example 1

Figure 6A:
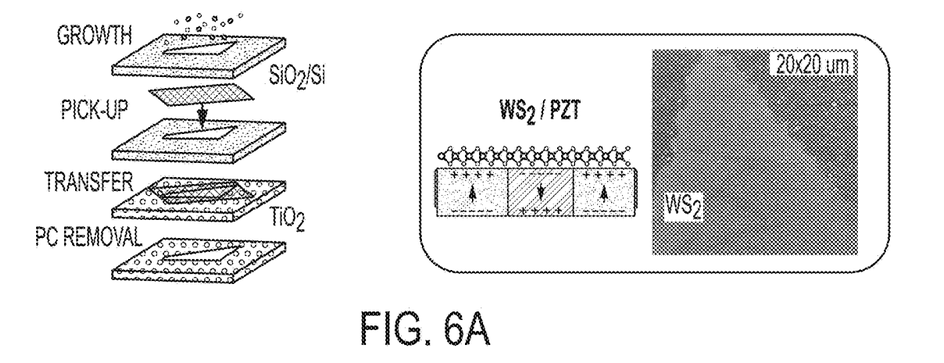
FIG. 6A depicts steps involved in a 2D material transfer process, along with a depiction of a structure formed by the process, and an image of a $WS_2$ monolayer transferred by the process.
Figure 6B:
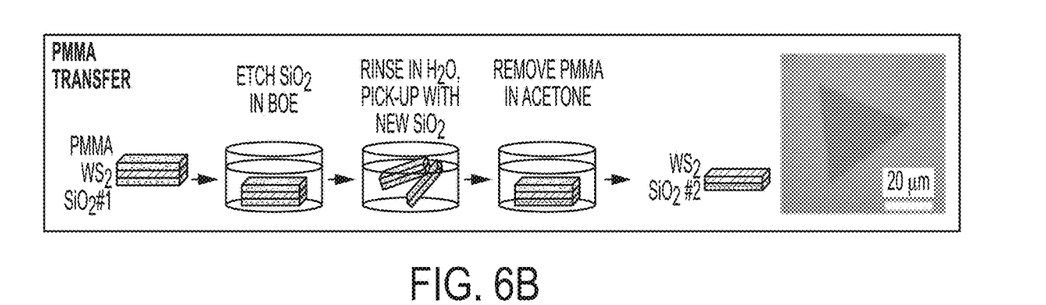
FIG. 6B depicts a PMMA film transfer method.

One method for mechanically transferring a TMD monolayer, such as $WS_2$, onto a substrate, such as a ferroelectric film, includes the use of a PMMA film, as illustrated in FIG. 6B. A sample including a layer of $WS_2$ on an $SiO_2$ substrate is coated with a thin layer of PMMA (polymethyl methacrylate) resist and cured on a hot plate at 100° C. for 10 minutes, then submerged in buffered hydrofluoric acid to etch the $SiO_2$, freeing the $WS_2$ from the growth substrate. Once fully etched, the film was rinsed in deionized $H_2O$, where it floated on the surface, and was then lifted from the water using the desired substrate. Optionally, adhesion of the $WS_2$ layer may be improved by spinning at 2000 rpm and baking at 100° C. An acetone and isopropanol soak removes the PMMA. An optical image of PMMA transferred $WS_2$ exhibits a uniform, clean, triangular shape, and is also shown in FIG. 6B.

Example 2

Figure 6C:
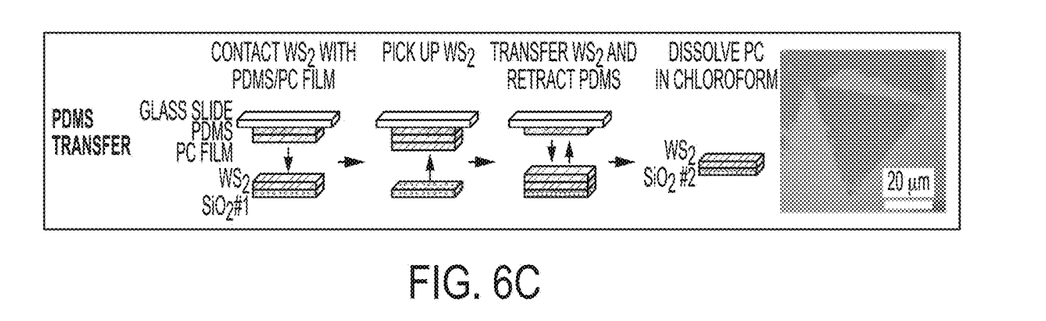
FIG. 6C depicts a PDMS film transfer method.

Another method for mechanically transferring a TMD monolayer, such as $WS_2$, onto a substrate, such as a ferroelectric film, includes the use of a PDMS/PC film, as illustrated in FIG. 6C. A sample including a layer of $WS_2$ on an $SiO_2$ substrate is brought into contact a PDMS/PC film, then retracted. This moves the $WS_2$ from $Si/SiO_2$ onto the PDMS/PC film. The PDMS/PC/$WS_2$ stack is then placed onto clean $Si/SiO_2$. The PDMS stamp is retracted, leaving the PC film on the top surface of $WS_2$, which is then dissolved in chloroform. An optical image following PDMS transfer is also shown in FIG. 6C.

Example 3

The carrier type and density in a single monolayer films $MoSe_2$ was controlled by a voltage applied to the electrostatic gate.

Figure 7A:
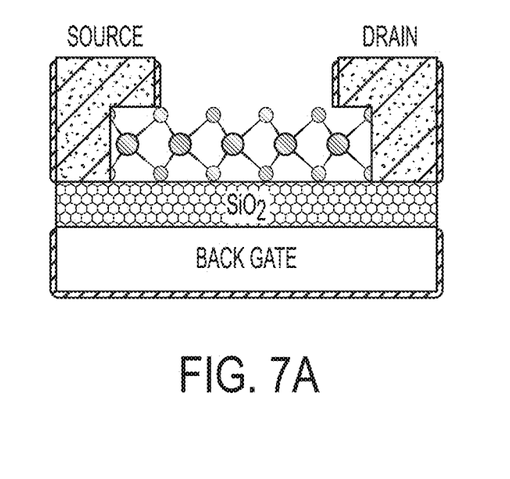
FIG. 7A depicts a cross-section of an MoSe$_2$ monolayer in a gate device.
Figure 7B:
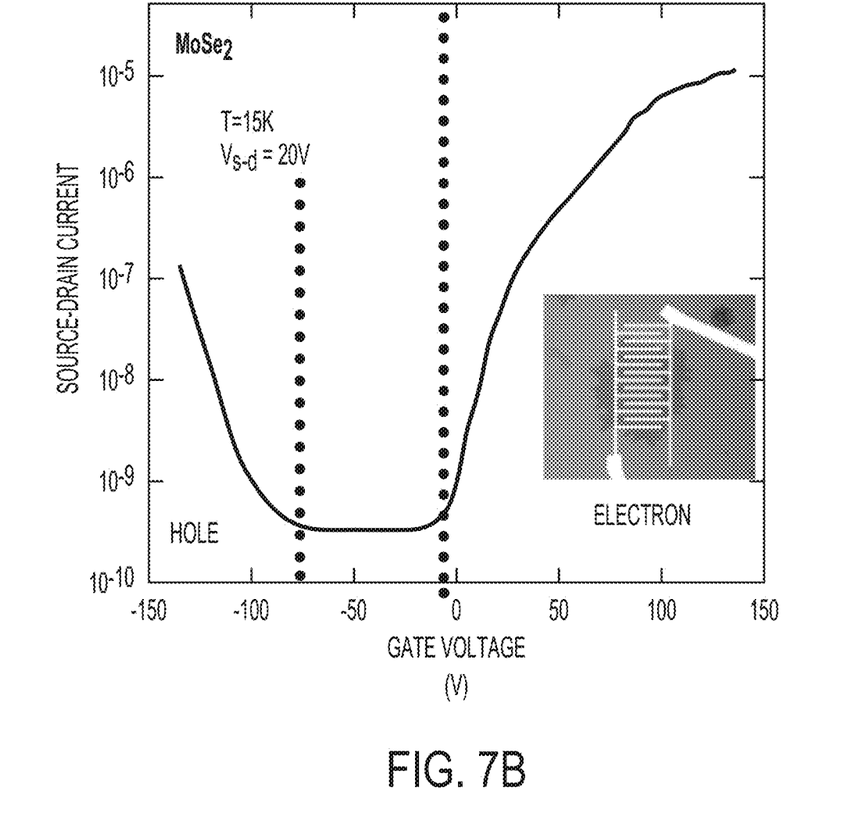
FIG. 7B is a graph of the observed gate voltage.

A cross section of a monolayer $MoSe_2$ was grown directly on an $SiO_2/Si(001)$ substrate. A cross-section of the structure is shown in FIG. 7A. The current between the source and drain contacts is determined by the external voltage applied to the gate, where the highly doped Si substrate serves as a gate contact, and the $SiO_2$ serves as the gate dielectric. As shown in FIG. 7B, when the gate voltage is negative, the $MoSe_2$ becomes p-type and the current is dominated by hole motion. When the gate voltage is positive, the $MoSe_2$ becomes n-type and the current is dominated by electron flow. This characteristic is known as "ambipolar."

For intermediate voltages, the $MoSe_2$ is depleted of carriers and becomes nearly insulating, with very little current flow. The ratio between the current in the "on" state for electron flow, and the "off" state where current flow is minimum, is greater than $10^4$. The gate voltages required in this example are large because the $SiO_2$ is thick (about 300 nm), and the electric field due to an external voltage applied to the Si substrate decreases as $t^{-1}$, where t is the thickness of the gate dielectric ($SiO_2$).

Example 4

Polarization domains were written into a 150 nm PZT/Pt/$SiO_2$/Si test sample using a conductive atomic force microscope (CAFM) manufactured by Park Systems (Suwon, South Korea), in order to demonstrate that polarization domains in the ferroelectric film control photoluminescence (PL) intensity of mechanically transferred $WS_2$ monolayers. The sample is shown in FIG. 8.

Figure 8:
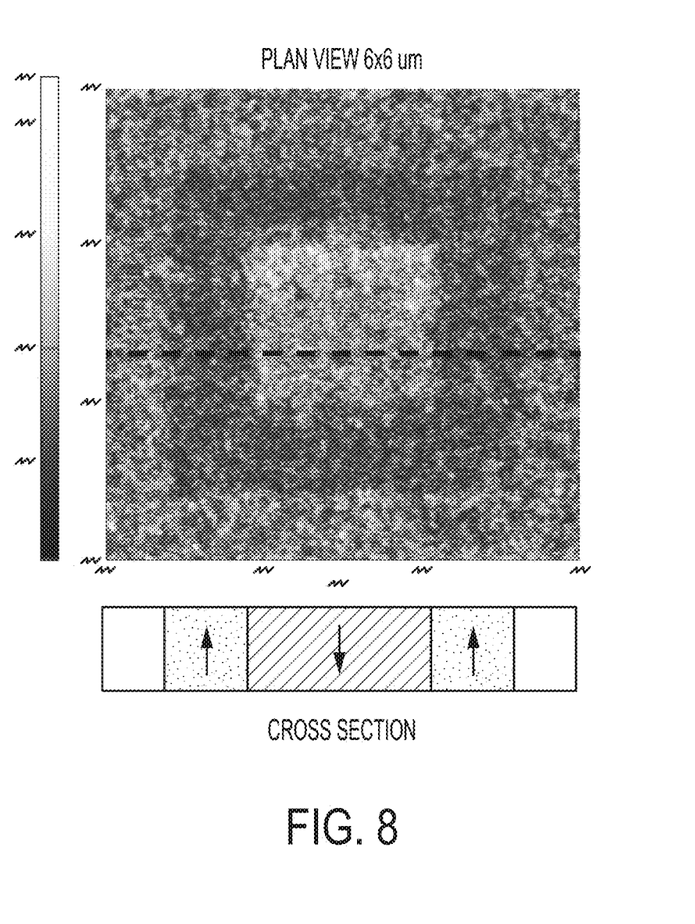
FIG. 8 depicts an exemplary configuration for polarization domains, written into a 150 nm PZT/Pt/SiO$_2$/Si test sample using a conductive atomic force microscope (CAFM).

The 6×6 micron image shown in FIG. 8 was obtained using the AFM operating in electric force microscopy imaging mode. The dark regions of the image correspond to the areas of the sample in which the AFM created dipole domains pointing up. The light regions of the image correspond to the areas of the sample in which the AFM created dipole domains pointing down. This is shown schematically in the accompanying cross section corresponding to the fiducial line drawn through the image. While the dipole domains shown here are about 500 nm in lateral dimension, domains on the scale of a few nanometers can also be successfully created and imaged.

Example 5

A large area monolayer $WS_2$ grown by a CVD process on a $SiO_2$/Si substrate in a 2 inch tube furnace. $WO_3$ powder and sulfur precursors were heated to 825° C. under a 100 sccm argon and 10 sccm hydrogen flow. Perylene-3,4,9,10-tetracarboxylic acid tetrapotassium salt was used as seed molecules to promote lateral growth. The monolayer nature was confirmed by Raman and PL mapping.

The $WS_2$ film was removed from the $SiO_2$/Si growth substrate and transferred onto a 100 nm thick PZT film on a conducting n-type strontium titanate wafer. Transfer was conducted using the method of Example 1. Before transfer, a metal marker grid pattern (Ti/Au) was deposited on the PZT film using either a shadow mask or photolithography technique, in order to assist in locating specific poled areas.

Polarization domains were written into the PZT film using a C-AFM (Park Systems NX-10), which was operated using dc voltages of up to ±10 V, using two types of cantilevers: Cr—Pt coated (Multi75E, Budget Sensors) and Au-coated (PPP-NCSTAu, Nanosensors) Si cantilevers. Similar results were obtained with both. A tip voltage of ±10 V direct current (dc) was applied in the contact mode, and polarization domains were written in a checkerboard pattern. Line scan densities of at least 512 lines per 10 μm were used to write the polarization domains into the PZT in a checkerboard pattern with the tip polarities shown. Dynamic contact electrostatic force microscopy was used to image the polarization state of the poled regions, at a frequency of 75-160 kHz. The total image size is 30×30 μm, and each poled square is 10×10 μm. The dashed lines are provided as a guide, and the bias voltages applied to the C-AFM tip are indicated.

Figure 9A:
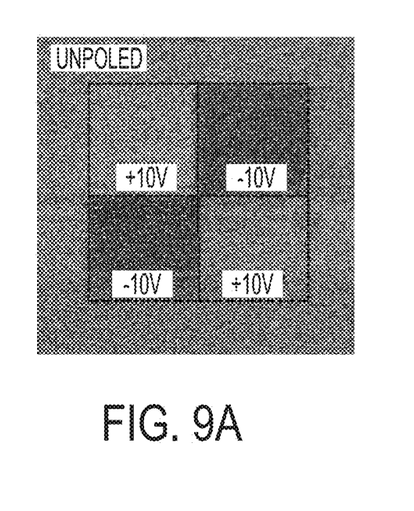
FIG. 9A is an image of a 100 nm PZT film surface poled using an atomic force microscopy (AFM) operated in the electrostatic force microscopy phase mode.

An image of the poled 100 nm PZT surface was obtained using the same AFM operated in the electrostatic force microscopy phase mode, and an EFM phase image of the area is shown in FIG. 9A.

Figure 9B:
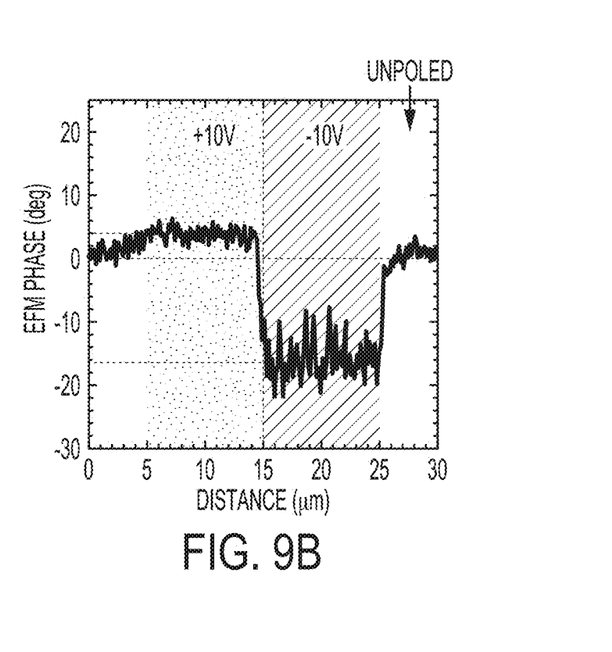
FIG. 9B is a horizontal EFM line scan averaged left to right across the top two panels of the checkerboard of FIG. 9A.
Figure 9C:
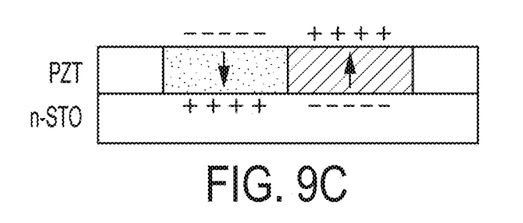
FIG. 9C is a schematic cross section of the PZT film, illustrating the orientation of the polarization domains and the corresponding surface charge.

FIG. 9B shows a horizontal EFM line scan averaged left to right across the top two panels of the checkerboard pattern. There is strong contrast between the squares written with opposite AFM tip polarities, indicating successful poling of the PZT film. There is little contrast between the areas of PZT that were not poled by the AFM and the squares that were intentionally poled using a +10 V tip bias, due to global poling of the entire PZT film before application of the AFM. FIG. 9C shows a schematic cross section of the PZT film illustrating the orientation of the polarization domains and corresponding surface charge.

Figure 9D:
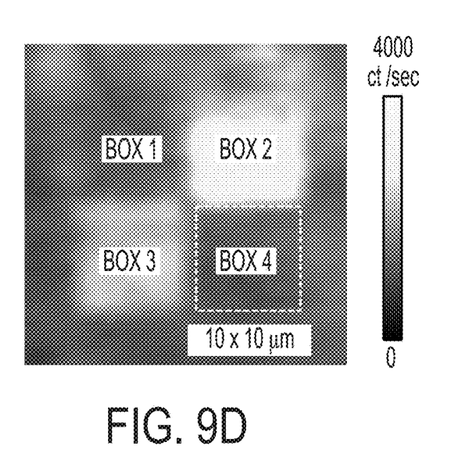
FIG. 9D is a PL peak intensity map obtained from the WS$_2$ monolayer.
Figure 9E:
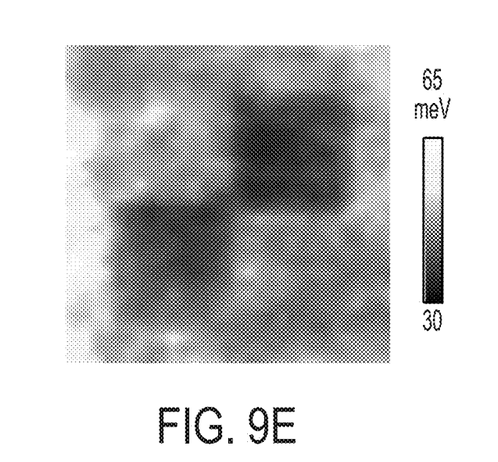
FIG. 9E is a spatial map of the PL linewidth (FWHM) corresponding to the data of FIG. 9D.

A PL peak intensity map was obtained from the $WS_2$ monolayer over a 30×30 μm area in the sample plane, acquired from a region of the PZT that was intentionally poled by the AFM with the checkerboard pattern, as shown in FIG. 9D. A spatial map of the PL linewidth (FWHM) corresponding to the data of FIG. 9D is shown in FIG. 9E.

It will, of course, be appreciated that the above description has been given by way of example only and that modifications in detail may be made within the scope of the present invention.

Throughout this application, various patents and publications have been cited. The disclosures of these patents and publications in their entireties are hereby incorporated by reference into this application, in order to more fully describe the state of the art to which this invention pertains.

The invention is capable of modification, alteration, and equivalents in form and function, as will occur to those ordinarily skilled in the pertinent arts having the benefit of this disclosure. While the present invention has been described with respect to what are presently considered the preferred embodiments, the invention is not so limited. To the contrary, the invention is intended to cover various modifications and equivalent arrangements included within the spirit and scope of the description provided above.

What is claimed:

1. A heterostructure comprising :
a multiferroic material layer; and
a two-dimensional material layer provided directly on the multiferroic material layer,
wherein the multiferroic material layer comprises an array of polarization domains in the multiferroic material layer, and produces corresponding lateral heterojunctions in the two-dimensional material layer; and
wherein the multiferroic material layer is selected from the group consisting of $BiMnO_3$, $LaMnO_3$, and $BiFeO_3$, and combinations thereof.

2. The heterostructure of claim 1, wherein the multiferroic material layer is a ferroelectric material layer.

3. The heterostructure of claim 2, wherein the polarization domains in the multiferroic material layer produce local electric fields that penetrate the two-dimensional material layer.

4. The heterostructure of claim 3, wherein the local electric fields modify carrier density and transport properties of the polarization_domains in the two-dimensional material layer.

5. The heterostructure of claim 4, wherein the lateral heterojunctions are selected from the group consisting of p-n heterojunctions, p-i-n heterojunctions, p-n-p heterojunctions, n-p-n heterojunctions, and combinations thereof.

6. The heterostructure of claim 2, wherein the ferroelectric material layer is selected from the group consisting of lead zirconate titanate (PZT), barium titanate, lead titanate, lead magnesium niobate-lead titanate (PMN-PT), and combinations thereof.

7. The heterostructure of claim 1, wherein the two dimensional material layer is selected from the group consisting of transition metal dichalcogenide (TMD), silicene, phosphorene, graphene, and combinations thereof.

8. The heterostructure of claim 7, wherein the two dimensional material layer is a TMD selected from the group consisting of $MoS_2$, $MoSe_2$, $WS_2$, and $WSe_2$.

9. A device comprising the heterostructure of claim 1.

10. The device of claim 9, wherein the device is selected from the group consisting of diodes, transistors, electroluminescent/light-emitting devices, structures exhibiting negative differential resistance, and non-volatile transistor memory.

* * * * *